(12) United States Patent
Thompson et al.

(10) Patent No.: US 10,886,031 B2
(45) Date of Patent: Jan. 5, 2021

(54) MINERAL INSULATED COMBINED FLUX LOOP AND B-DOT WIRE

(71) Applicant: TAE TECHNOLOGIES, INC., Foothill Ranch, CA (US)

(72) Inventors: Matthew Thompson, Foothill Ranch, CA (US); Thomas Roche, Foothill Ranch, CA (US); Erik Trask, Foothill Ranch, CA (US); Kurt Knapp, Foothill Ranch, CA (US)

(73) Assignee: TAE TECHNOLOGIES, INC., Foothill Ranch, CA (US)

( * ) Notice: Subject to any disclaimer, the term of this patent is extended or adjusted under 35 U.S.C. 154(b) by 0 days.

(21) Appl. No.: 16/233,612

(22) Filed: Dec. 27, 2018

(65) Prior Publication Data

US 2019/0214155 A1    Jul. 11, 2019

Related U.S. Application Data

(63) Continuation of application No. PCT/US2017/039766, filed on Jun. 28, 2017.
(Continued)

(51) Int. Cl.
*G21B 1/05* (2006.01)
*G01R 33/02* (2006.01)
*G01R 33/022* (2006.01)

(52) U.S. Cl.
CPC .......... *G21B 1/052* (2013.01); *G01R 33/02* (2013.01); *G01R 33/022* (2013.01); *G21B 1/05* (2013.01); *Y02E 30/10* (2013.01)

(58) Field of Classification Search
CPC .......... F01D 17/06; F02C 9/28; G01F 23/242; G01F 23/26; G01F 23/268; G01P 3/488;
(Continued)

(56) References Cited

U.S. PATENT DOCUMENTS 4,236,964 A * 12/1980 Bass .................. G21B 1/11
376/133
H24 H    2/1986 Kugel et al.
(Continued)

FOREIGN PATENT DOCUMENTS

CN    105139929 A    12/2015
CN    105590666 A    5/2016
(Continued)

OTHER PUBLICATIONS

WO, PCT/US2017/039766 ISR and Written Opinion, dated Sep. 7, 2017.
(Continued)

*Primary Examiner* — Renan Luque
(74) *Attorney, Agent, or Firm* — One LLP

(57) ABSTRACT

A combination flux loop and B-dot probe comprising a single mineral insulated cable having an outer sheath of, e.g., stainless steel or the like, and three (3) conductors positioned within the sheath and embedded in a mineral insulator such as, e.g., MgO. One of the conductors forms a flux loop having a single loop and second and third conductors forming a B-dot probe comprises a single wire having a double loop. The combination probe is configured to prevent twisting of the conductors along a curved bend as the combined probe is fashioned into a curved shape. To prevent twisting, the conductors may be formed as ribbon wires having a generally flat, rectangular shaped cross-section and/or the sheath may have a generally oval or rectangular shaped cross-section.

19 Claims, 3 Drawing Sheets

Related U.S. Application Data

(60) Provisional application No. 62/361,980, filed on Jul. 13, 2016, provisional application No. 62/356,344, filed on Jun. 29, 2016.

(58) Field of Classification Search
CPC ..... G01P 3/49; G01R 29/0878; G01R 15/181; G01R 15/183; G01R 31/50; G01R 33/022; G01R 33/02; Y10T 428/2944; Y10T 428/2947; Y10T 428/2949; Y10T 428/2958; H01F 27/2823; H01F 38/30; H01F 5/00; H01F 5/02; Y02E 30/126; H01B 11/1808; H01B 11/1817; H01B 11/1839; G21B 1/052; G21B 1/05
See application file for complete search history.

(56) References Cited

U.S. PATENT DOCUMENTS

| | | | |
|---|---|---|---|
| 4,581,291 A | | 4/1986 | Bongianni |
| 4,647,849 A | * | 3/1987 | Strickland .......... G01R 29/0878 324/72.5 |
| 4,835,472 A | * | 5/1989 | Zabel .................. G01R 33/341 324/318 |
| 6,414,475 B1 | | 7/2002 | Dames et al. |
| 2006/0066304 A1 | * | 3/2006 | Schill, Jr. .......... G01R 29/0878 324/258 |
| 2006/0267504 A1 | * | 11/2006 | VanDrie ............... G21B 1/052 315/111.41 |
| 2009/0309577 A1 | | 12/2009 | Turner |
| 2010/0039108 A1 | * | 2/2010 | Haevescher .......... G01D 5/145 324/261 |
| 2011/0116197 A1 | * | 5/2011 | Zylstra ................ G01R 15/183 361/42 |
| 2013/0314083 A1 | * | 11/2013 | Loglisci ............... G01R 3/00 324/244 |
| 2013/0333466 A1 | | 12/2013 | Schmidt et al. |
| 2017/0076921 A1 | * | 3/2017 | Sakiyama ......... H01J 37/32935 |
| 2017/0303380 A1 | * | 10/2017 | Zindler ................ G21B 1/21 |
| 2019/0079141 A1 | * | 3/2019 | Marauska .............. G01D 3/08 |

FOREIGN PATENT DOCUMENTS

| | | | |
|---|---|---|---|
| DE | 196 18 989 A1 | 11/1997 | |
| DE | 103 00 168 A1 | 7/2004 | |
| JP | 2000-321388 A | 11/2000 | |
| JP | 2001-194181 A | 7/2001 | |
| JP | 2003-017311 A | 1/2003 | |
| KR | 10-0729545 B1 | 6/2007 | |
| WO | WO-2015068192 A1 | * 5/2015 | ............... H01F 5/00 |

OTHER PUBLICATIONS

Pomeroy, S. P., et al., "Electromagnetism surrounding Plasmoid Formation in an FRC Test Article", American Institute of Aeronautics and Astronautics, 2015, pp. 1-10.
EP, 17821155.3 Supplementary Search Report, dated Jan. 24, 2020.
EP, 17821155.3 Extended Search Report, dated Apr. 23, 2020.
SG, 11201811576S Written Opinion, dated Mar. 5, 2020.

* cited by examiner

MINERAL INSULATED COMBINED FLUX LOOP AND B-DOT WIRE

CROSS-REFERENCE TO RELATED APPLICATIONS

The subject application is a continuation of PCT Patent Application No. PCT/US17/39766, filed Jun. 28, 2017, which claims priority to U.S. Provisional Patent Application No. 62/361,980, filed on Jul. 13, 2016, and U.S. Provisional Patent Application No. 62/356,344, filed on Jun. 29, 2016, all of which are incorporated by reference herein in their entireties for all purposes.

FIELD

The subject matter described herein relates generally to plasma diagnostics and, more particularly, to a magnetic diagnostic probe that facilitates measurement of the changing magnetic fields generated by a plasma and magnet coils.

BACKGROUND

Inductive magnetic diagnostics are used to measure the changing magnetic fields generated by plasmas and magnet coils. Many parameters of plasma, such as, e.g., a field-reversed configuration (FRC) plasma, can be inferred from magnetic measurements, including: size, shape, location, global instability modes, and frequency-high fluctuations. Quality measurements of these various parameters require specialized arrays of individual magnetic sensors placed throughout the inner wall of the vacuum or confinement vessel. Each individual magnetic sensor is typically a loop of wire connected to an analog integrator and data acquisition electronics. This type of sensor is usually called a magnetic probe or B-dot if it is small in cross-sectional area or a flux loop if it is large. While these magnetic sensors are conceptually very simple, the design of practical magnetic diagnostic systems is complicated by an assortment of factors, including: detection bandwidth, noise pickup, vacuum compatibility, radiation environment compatibility, general durability, align-ability, and signal drift. Balancing the trade-offs inherent in the interplay between all these factors is the key to designing a successful magnetic diagnostic system.

Magnetic probes and flux loops are venerable types of plasma diagnostic that are both robust and effective. These devices employ Faraday's law of induction to measure magnetic field and flux. Changes in the magnetic flux $\Phi = \int \vec{B} \cdot \vec{n} \, da$ passing through coils of wire produces a voltage $V_c$ that is proportional to the time derivative of the magnetic field component B parallel to the axis of coil, $$V_c = -\frac{d\Phi}{dt} = -n_c a_c \frac{dB}{dt} \quad (1)$$

where $n_c$ is the number of turns, and ac is the area of each turn. Measurements of $V_c$ can therefore be integrated, either electronically or through computation, to yield values for either $\Phi$ or B depending on the configuration of the coil. Single-turn coils that encompass large areas are used to measure $\Phi$ and are referred to as flux loops. Multi-turn coils that are small enough that the magnetic field inside them can be assumed to be uniform are called magnetic probes or B-dot probes and are used to measure B.

The shape, size, and longitudinal position of an FRC plasma can be inferred from the magnetic flux excluded by the FRC plasma. A uniform magnetic field typical fills the confinement chamber of an FRC plasma confinement system prior to the initiation of the plasma. This field is represented by $B_0$ in FIG. 1. The diamagnetic properties of the plasma toroid, combined with the flux conserver properties of the vacuum vessel, results in the compression of the initial confinement chamber magnetic field between the FRC and wall when the plasma enters the confinement region from the formation section. The resulting field increase in the area external to the FRC, $B_e$ in FIG. 1, is measured by magnetic probes positioned just inside the chamber wall. In the ideal case, the excluded flux radius $r_{\Delta\varphi}$ is simply given by $r_{\Delta\varphi} = r_w \sqrt{1 - B_0/B_e}$ where $r_w$ is the wall radius. The excluded flux $r_{\Delta\varphi}$ radius is approximately equal to the separatrix radius $r_s$ under most conditions. The separatrix is the surface of demarcation between open and closed field lines that defines the FRC.

Monitoring the magnetic field generated by the magnet coils is an important secondary function of the magnetic diagnostics. Mistakes can occur when magnet coils are connected or in the programming of their power supplies. Therefore, it is desirable to have an independent means of verifying that the actual magnetic field in the device is the same as what was requested. Magnetic diagnostics, most of which are absolutely calibrated to known magnetic fields before installation, provide this capability.

Rather than using discrete probes and assumptions about flux conservation, there are instances where it is necessary to directly measure the quantities of interest using flux loops and annular B-dot probes. However, space and the practical number of penetrations in a vacuum vessel is always limited, which makes providing the optimum number of individual flux loops and B-dot probes difficult.

Therefore, it is desirable to provide improved flux loops and B-dot probes.

BRIEF DESCRIPTION OF FIGURES

The details of the example embodiments, including structure and operation, may be gleaned in part by study of the accompanying figures, in which like reference numerals refer to like parts. The components in the figures are not necessarily to scale, emphasis instead being placed upon illustrating the principles of the invention. Moreover, all illustrations are intended to convey concepts, where relative sizes, shapes and other detailed attributes may be illustrated schematically rather than literally or precisely.

It should be noted that elements of similar structures or functions are generally represented by like reference numerals for illustrative purpose throughout the figures. It should also be noted that the figures are only intended to facilitate the description of the preferred embodiments.

DESCRIPTION

Each of the additional features and teachings disclosed below can be utilized separately or in conjunction with other features and teachings to provide a combined flux loop and b-dot probe. Representative examples of the embodiments described herein, which examples utilize many of these additional features and teachings both separately and in combination, will now be described in further detail with reference to the attached drawings. This detailed description is merely intended to teach a person of skill in the art further details for practicing preferred aspects of the present teachings and is not intended to limit the scope of the invention. Therefore, combinations of features and steps disclosed in the following detail description may not be necessary to practice the invention in the broadest sense, and are instead taught merely to particularly describe representative examples of the present teachings.

Moreover, the various features of the representative examples and the dependent claims may be combined in ways that are not specifically and explicitly enumerated in order to provide additional useful embodiments of the present teachings. In addition, it is expressly noted that all features disclosed in the description and/or the claims are intended to be disclosed separately and independently from each other for the purpose of original disclosure, as well as for the purpose of restricting the claimed subject matter independent of the compositions of the features in the embodiments and/or the claims. It is also expressly noted that all value ranges or indications of groups of entities disclose every possible intermediate value or intermediate entity for the purpose of original disclosure, as well as for the purpose of restricting the claimed subject matter.

Figure 1:
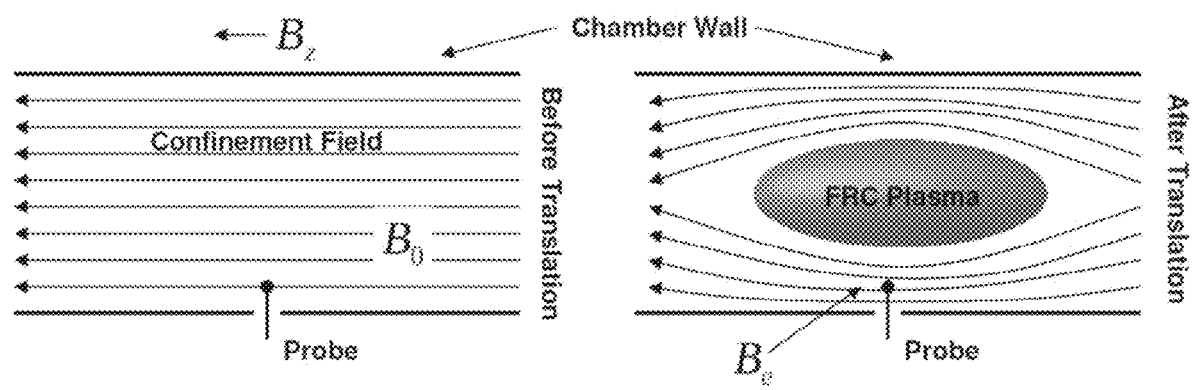
FIG. 1 is an illustration of the exclusion of preexisting magnetic flux (left) by the arrival of an FRC plasma (right).
Figure 2:
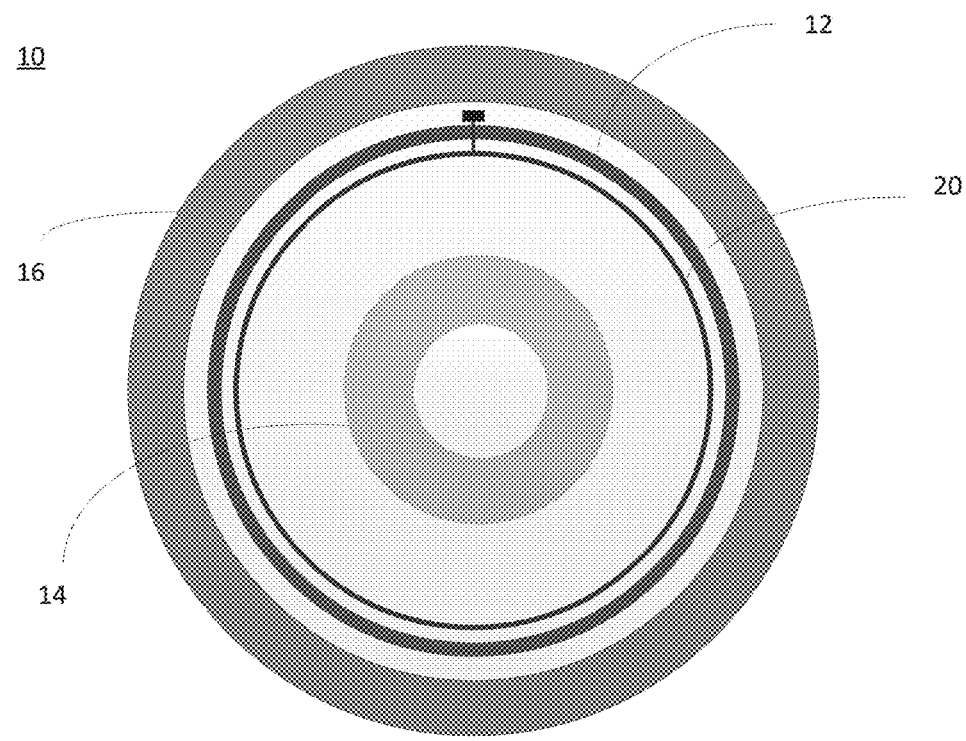
FIG. 2 is an end view cross-section illustration of an FRC confinement system with a combined flux loop and B-dot probe positioned therein.

Embodiments provided herein are directed to a combined flux loop and b-dot probe that facilitates mounting within a confinement vessel along the curvature of the vessel's internal wall. Turning to FIG. 2, an FRC plasma confinement system 10 is shown comprising a confinement chamber or vessel 12, an FRC plasma 14 confined within the vessel 12, and a solenoid magnetic coil 16 positioned about the vessel 12. A combination flux loop and B-dot probe 20 is positioned about the interior wall of the vessel 12.

B-dot probes and flux loops are venerable types of plasma diagnostics that are both robust and effective. Hot plasma environments where diagnostic sensors are subject to plasma radiation and/or neutron fluence, such as, e.g., the interior of the confinement vessel 12 of the FRC plasma confinement system 10, or tokamaks and the like, require sensors that will not overheat due to plasma radiation heating and require sensor materials that can survive neutron fluence. Mineral insulated cables, which include a non-organic insulating material comprising, e.g., MgO or the like, are typically used in hot plasma environments where neutron fluence is high. See, e.g., Hodapp et. al, "Magnetic diagnostics for future tokamaks," *Proceedings of 16th International Symposium on Fusion Engineering*, Champaign, Ill., 1995, pp. 918-921 vol. 2, which is incorporated herein by reference.

Figure 3:
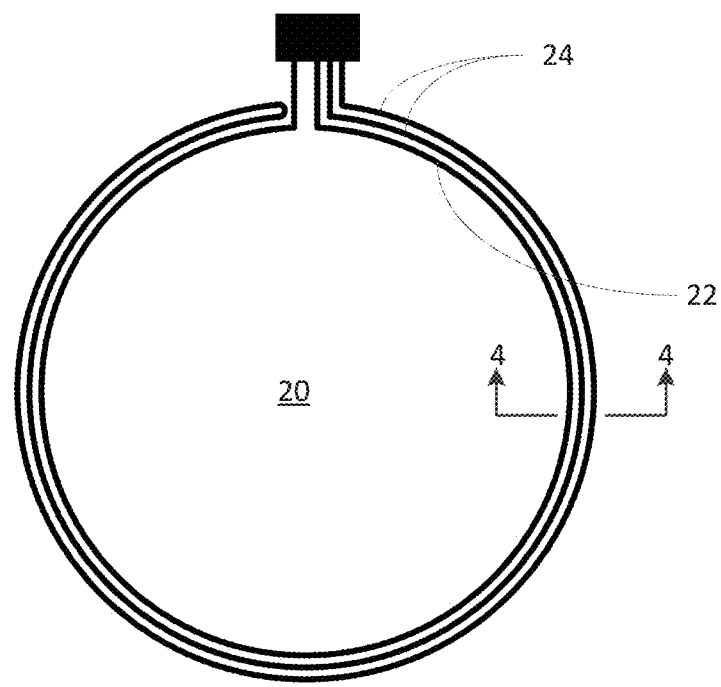
FIG. 3 is an illustration of a three (3) wire configuration of a combined flux loop and B-dot probe of the present embodiments.
Figure 4:
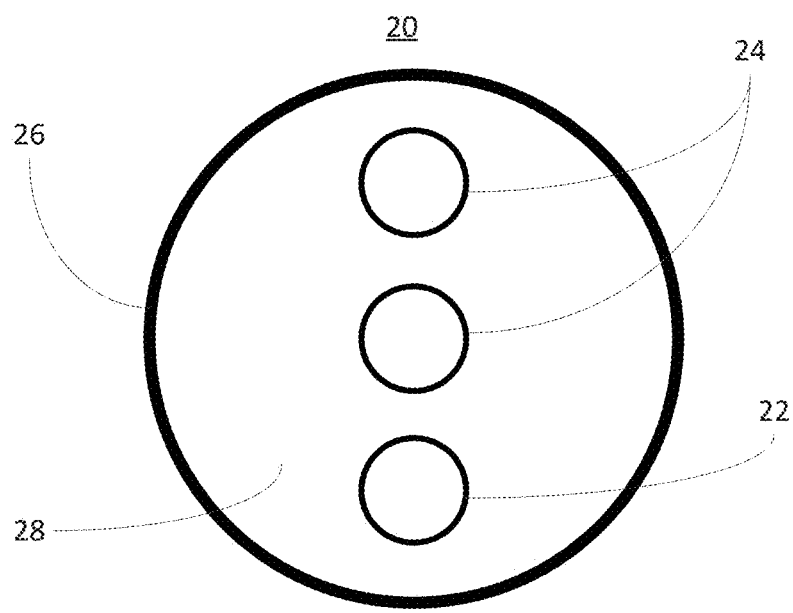
FIG. 4 is a cross-sectional illustration of the combined flux loop and B-dot probe take along line 4-4 in FIG. 3.

As shown in FIGS. 3 and 4, the combination probe 12 preferably comprises a single mineral insulated cable having an outer sheath 26 comprising, e.g., stainless steel, Inconel, or another high-temperature metal alloy, and three (3) conductors 22 and 24 positioned within the sheath 26 and embedded in a mineral insulator 28 comprising a non-organic mineral insulator such as, e.g., MgO, $SiO_2$, or another compactable insulating mineral powder. One of the conductors 22 forms a flux loop 22 that travels around the entire vessel 12 one time, is twisted on itself and exits the vessel 12. Second and third conductors form a B-dot probe 24, which is very sensitive to a variation in area. The B-dot 24 comprises a single wire that loops around the vessel 12 two (2) times. The wire 24 is shorted on one end, twisted on itself and exits the vessel 12.

In order for the flux loop 22 and the B-dot 24 probes to function properly while contained within a single mineral insulated cable, the three (3) conductors 22 and 24 of the combined probe 20 are preferably aligned perpendicular to the wall of the vessel 12. If twisting were to occur along a curved bend as the combined probe 20 is fashioned into a curved shape, it would result in a reduction in cross-section area between conductors, which tends to be problematic for the B-dot 24, which, as noted above, tends to be very sensitive to a variation in area.

Figure 5:
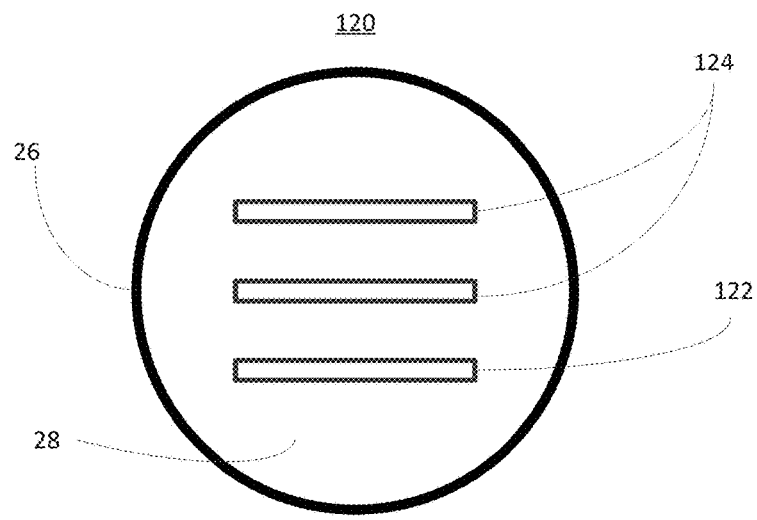
FIGS. 5, 6 and 7 are cross-sectional illustrations of alternate embodiments of the combined flux loop and B-dot probe.

Turing to FIG. 5, an embodiment of the combined probe 120 includes a cable comprising three (3) ribbon wires 122 and 124, which are formed of, e.g., copper or the like, and have a generally flat, rectangular shaped cross-section. The ribbon wires 122 and 124 are stacked along their width in spaced relation. This stacked ribbon wire configuration tends to prevent twisting as the combined probe 120 is fashioned into a curved shape. Of the three ribbons, one ribbon 122 is used for a flux loop and the two other ribbons 124 preferably comprise a single ribbon forming B-dot probes.

Figure 6:
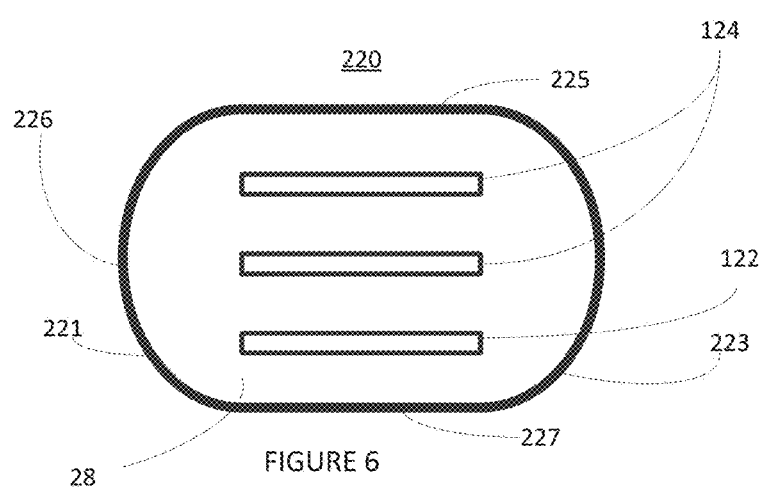

Another embodiment of the combined probe 220 is shown in FIG. 6. As depicted, the outer sheath 226 preferably comprising opposing elongate flat sides forming a generally oval, rectangular, or the like, shaped cross-section. As depicted, the sheath 226 includes opposing flat sides 225 and 227 extending between arcuate ends 221 and 223. As further depicted, the three (3) ribbon wires 122 and 124 are stacked in spaced relation along the wide flat sides 225 and 227 of the sheath 226. The oval shaped cross-sectional configuration of the sheath 226, along with the rectangular cross-sectional configuration of the ribbon wires 122 and 124 tends to further prevent the ribbon wires 122 and 124 from twisting as the combined probe 220 is fashioned into a curved shape.

Figure 7:
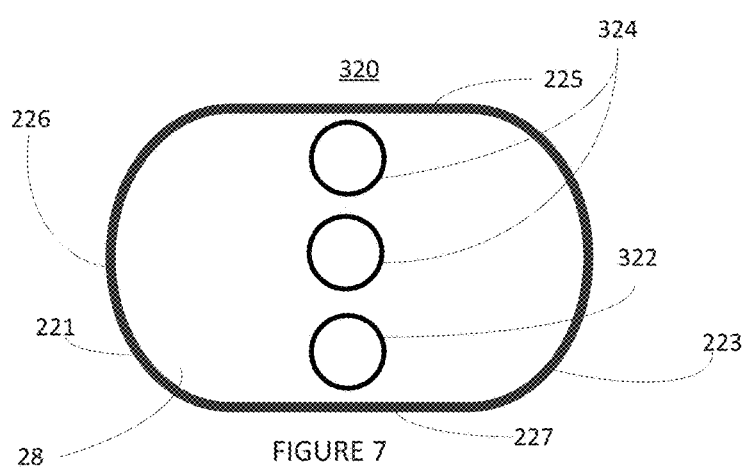

In yet another embodiment of the combined probe 320 as shown in FIG. 7, includes the outer sheath 226 preferably comprising opposing elongate flat sides forming a generally oval, rectangular, or the like, shaped cross-section. As depicted, the sheath 226 includes opposing flat sides 225 and 227 extending between arcuate ends 221 and 223. However, instead of stacked flat ribbon wires, the three (3) conductors 322 and 324 may have any cross-sectional shape including, e.g., circular, square, octagonal and the like. The wide flat sides 225 and 227 of the outer sheath 226 tend to prevent the three (3) conductors 322 and 124 from twisting as the combined probe 320 is fashioned into a curved shape.

Although the embodiments presented herein were discussed with regard to an FRC plasma environment for exemplary purposes only, the embodiments presented herein may be used in a variety of hot environments subject to plasma radiation and/or neutron fluence, such as, e.g., tokamaks and the like.

The example embodiments provided herein, however, are merely intended as illustrative examples and not to be limiting in any way.

All features, elements, components, functions, and steps described with respect to any embodiment provided herein are intended to be freely combinable and substitutable with those from any other embodiment. If a certain feature, element, component, function, or step is described with respect to only one embodiment, then it should be understood that that feature, element, component, function, or step can be used with every other embodiment described herein unless explicitly stated otherwise. This paragraph therefore serves as antecedent basis and written support for the introduction of claims, at any time, that combine features, elements, components, functions, and steps from different embodiments, or that substitute features, elements, components, functions, and steps from one embodiment with those of another, even if the following description does not explicitly state, in a particular instance, that such combinations or substitutions are possible. Express recitation of every possible combination and substitution is overly burdensome, especially given that the permissibility of each and every such combination and substitution will be readily recognized by those of ordinary skill in the art upon reading this description.

In many instances, entities are described herein as being coupled to other entities. It should be understood that the terms "coupled" and "connected" (or any of their forms) are used interchangeably herein and, in both cases, are generic to the direct coupling of two entities (without any non-negligible (e.g., parasitic) intervening entities) and the indirect coupling of two entities (with one or more non-negligible intervening entities). Where entities are shown as being directly coupled together, or described as coupled together without description of any intervening entity, it should be understood that those entities can be indirectly coupled together as well unless the context clearly dictates otherwise.

While the embodiments are susceptible to various modifications and alternative forms, specific examples thereof have been shown in the drawings and are herein described in detail. It should be understood, however, that these embodiments are not to be limited to the particular form disclosed, but to the contrary, these embodiments are to cover all modifications, equivalents, and alternatives falling within the spirit of the disclosure. Furthermore, any features, functions, steps, or elements of the embodiments may be recited in or added to the claims, as well as negative limitations that define the inventive scope of the claims.

What is claimed:

1. A plasma confinement system comprising
   a confinement chamber or vessel,
   a magnetic coil positioned external to the vessel and extending circumferentially around and adjacent to an outer wall of the vessel,
   a combination probe comprising a single cable having an outer sheath and a plurality of conductors positioned within the outer sheath, the plurality of conductors including a flux loop and one or more B-dot probes, the combination probe being positioned adjacent to an interior wall of the vessel and extending circumferentially around an interior space of the vessel, wherein the outer sheath includes first and second elongate flat sides with the first flat side opposingly positioned in spaced relation to the second flat side, wherein individuals one of the plurality of conductors are positioned in spaced relation to one another and the first and second flat sides and positioned in a stacked orientation along a direction orthogonal to the first and second flat sides.

2. The plasma confinement system of claim 1 wherein the cable comprises a mineral insulator.

3. The plasma confinement system of claim 2 wherein the plurality of conductors comprises three (3) conductors positioned within the outer sheath and embedded in the mineral insulator.

4. The plasma confinement system of claim 3 wherein the mineral insulator comprises a compactable insulating mineral powder including one of MgO or $SiO_2$.

5. The plasma confinement system of claim 3 wherein one of the three conductors forms the flux loop comprising a single wire having a single loop.

6. The plasma confinement system of claim 5 wherein the other two of the three conductors forms the B-dot probe comprising a single wire having a double loop.

7. The plasma confinement system of claim 1 wherein the conductors are ribbon wires having a generally flat, rectangular shaped cross-section.

8. The plasma confinement system of claim 1 wherein the outer sheath having one of an oval shaped cross-section or a rectangular shaped cross-section.

9. The plasma confinement system of claim 8 wherein the sheath includes opposing flat sides extending between opposing ends.

10. The plasma confinement system of claim 8 wherein the first and second flat sides extending between arcuate ends.

11. A combination magnetic sensing probe comprising
    a single cable having an outer sheath, and
    a plurality of conductors comprising a first probe and one or more second probes positioned within the outer sheath, wherein the outer sheath includes first and second elongate flat sides with the first flat side opposingly positioned in spaced relation to the second flat side, wherein individuals one of the plurality of conductors are positioned in spaced relation to one another and the first and second flat sides and positioned in a stacked orientation along a direction orthogonal to the first and second flat sides.

12. The probe of claim 11 wherein the cable comprises a mineral insulator.

13. The probe of claim 12 wherein the plurality of conductors comprises three (3) conductors positioned within the outer sheath and embedded in the mineral insulator.

14. The probe of claim 13 wherein the mineral insulator comprises a compactable insulating mineral powder including one of MgO or $SiO_2$.

15. The probe of claim 13 wherein one of the three conductors forms the flux loop for the first probe comprising a single wire having a single loop.

16. The probe of claim 15 wherein the other two of the three conductors forms the B-dot probe for the second probe comprising a single wire having a double loop.

17. The probe of claim 11 wherein the conductors are ribbon wires having a generally flat, rectangular shaped cross-section.

18. The probe of claim 11 wherein outer sheath having one of an oval shaped cross-section or a rectangular shaped cross-section.

19. The probe of claim 18 wherein the sheath includes opposing flat sides extending between opposing ends.

* * * * *